United States Patent [19]

Steckler et al.

[11] 3,984,729

[45] Oct. 5, 1976

[54] DEFLECTION WAVEFORM CORRECTION SIGNAL GENERATOR

[76] Inventors: Steven Alan Steckler, 259 Willow Way, Clark; Alvin Reuben Balaban, 5 Thompson St., Raritan, both of N.J. 08876

[22] Filed: Sept. 27, 1974

[21] Appl. No.: 510,097

[52] U.S. Cl. ............................. 315/370; 315/371; 315/408
[51] Int. Cl.² ................... H01J 29/70; H01J 29/56
[58] Field of Search .......... 315/386, 370, 383, 371, 315/384, 385, 408

[56] References Cited
UNITED STATES PATENTS

| | | |
|---|---|---|
| 3,191,090 | 6/1965 | Vitt, Jr. et al. ..................... 315/386 |
| 3,668,463 | 6/1972 | Smith et al. ........................ 315/370 |
| 3,819,979 | 6/1974 | Truskalo ............................. 315/370 |

*Primary Examiner*—Maynard R. Wilbur
*Assistant Examiner*—S. C. Buczinski

[57] ABSTRACT

Cascaded multipliers are coupled to a source providing a periodic sawtooth deflection waveform, the amplitude of which varies with variations in the high voltage applied to an accelerating anode of a kinescope. The sawtooth signal is cubed by the cascaded multipliers and multiplied by the inverse square of a voltage which varies with changes in the kinescope anode potential. The system thus incorporates S-correction and means for correcting the deflection waveform to compensate for changes in the high voltage supplied to the kinescope anode.

6 Claims, 2 Drawing Figures

DEFLECTION WAVEFORM CORRECTION SIGNAL GENERATOR

BACKGROUND OF THE INVENTION

This invention relates to arrangements for providing deflection correction waveforms for kinescopes.

It is known that coupled multipliers may be used to provide kinescope deflection waveform S-correction for modifying the shape of substantially linearly varying deflection waveforms. S-shaping of the deflection waveform is necessary to correct the deflection scanning rate of an electron beam impinging upon the display face of a substantially flat-faced kinescope. The S-correcting waveform is typically a "third power" waveform of the substantially linearly varying deflection sawtooth waveform.

Other types of deflection waveform corrections are frequently provided to the substantially linearly varying deflection waveform to insure that the information contained in the electron beam is accurately displayed on the kinescope face. For example, it is known that to achieve deflection which is non-varying with changes in kinescope anode accelerating voltage, the deflection current waveform must vary directly with the square root of the high voltage applied to the accelerating anode of the kinescope. See, e.g., Boekhorst, A. an Stolk, J., *Television Deflection Systems*, Phillips Technical Library, 1962, Para. 4.1.2.

Typically, the correction necessary to achieve non-varying deflection with changes in accelerating anode voltage is provided by varying the deflection waveform directly as the sum of a constant voltage and a voltage related to the accelerating anode voltage. This is frequently achieved by charging a capacitor in the deflection waveform generator from two current sources. One source provides substantially constant current and the other provides current which varies directly with changes in the accelerating voltage. The voltage provided across the capacitor is thus corrected for changes in the accelerating voltage since the sum of a constant voltage and an accelerating voltage-related voltage is proportional to the first two terms of a Taylor's series expansion of the square root of the accelerating voltage.

However, where other deflection waveform corrections, such as S-correction, take place intermediate the accelerating anode voltage correction and the deflection winding, the final anode voltage correction will be changed by these intermediate corrections so that it will no longer provide the square root relation necessary to correct for changes in the accelerating anode voltage.

SUMMARY OF THE INVENTION

In accordance with the invention, a deflection waveform correction system is provided for compensating the deflection waveform for S-correction and the effects of high voltage changes. A deflection sawtooth waveform generator is coupled to a source of voltage related to the square root of the high voltage and responsive thereto for imparting changes of the voltage to a first sawtooth waveform. First means are coupled to the sawtooth waveform generator and to the source of voltage for decoupling the voltage variations from the sawtooth waveform and for producing an S-corrected second sawtooth waveform which is substantially independent of the voltage changes. Second means are coupled to the first means for combining the S-corrected second sawtooth waveform with the first sawtooth waveform including the voltage changes for producing a third sawtooth waveform which is S-corrected and compensated directly proportional to the square root of the high voltage.

The invention may best be understood by referring to the following description and accompanying drawings of which:

FIG. 1 illustrates a partly block and partly schematic diagram of a system utilizing a preferred embodiment of the invention; and FIG. 2 illustrates a schematic diagram of a preferred embodiment of the invention.

DESCRIPTION OF THE PREFERRED EMBODIMENT

Figure 1:
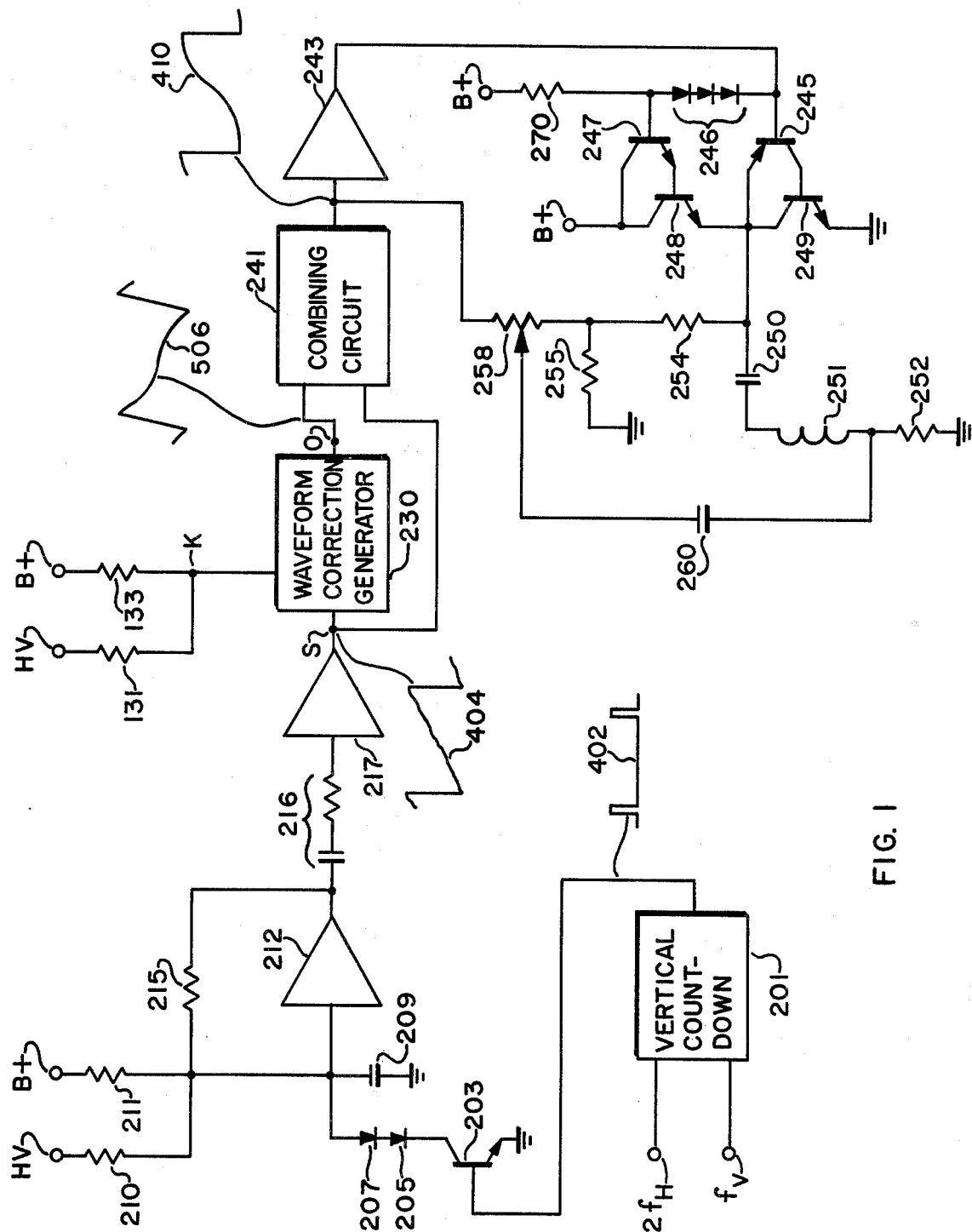

In FIG. 1, a pulse at twice the horizontal deflection frequency is coupled from, for example, a horizontal oscillator (not shown) to an input terminal $2f_H$ of a count-down vertical sync generator 201. Count-down vertical sync generator 201 may be one of several known types of count-down vertical deflection circuits which provide output signals at the vertical deflection rate similar to those illustrated by waveform 402. A received vertical sync pulse is coupled from a sync separator (not shown) to an input terminal $f_v$ of count-down system 201. In such systems, the doubled horizontal frequency pulse at $2f_H$ is generally divided to produce a pulse at the vertical sync rate, the phase of which is then compared to the received vertical sync pulse coupled to terminal $f_v$. The received vertical sync at terminal $f_v$ is thus used to update the internally generated vertical sync signal obtained by dividing the doubled horizontal rate pulse at terminal $2f_H$, thereby insuring that the internally generated pulse is in sync with the received vertical sync.

Signal 402 at the vertical deflection rate is coupled from vertical count-down system 201 to the base of a vertical sawtooth discharge switch transistor 203. The emitter of transistor 203 is grounded. The collector of transistor 203 is coupled through two diodes 205 and 207 to a terminal of a vertical sawtooth capacitor 209. The remaining terminal of capacitor 209 is grounded. Capacitor 209 is coupled to a voltage supply terminal HV through a resistor 210 and to a voltage supply terminal B+ through a resistor 211. Capacitor 209 is also coupled to an input terminal of an amplifier 212. Feedback is coupled from the output terminal of amplifier 212 through a resistor 215 to the input terminal of amplifier 212. The voltage source of terminal HV is related to the final anode potential of the receiver kinescope and varies therewith.

The output terminal of amplifier 212 is also coupled through a coupling circuit 216 to the input terminal of an amplifier 217. The output terminal of amplifier 217 is coupled to an input terminal S of a waveform correction generator 230. Voltage source B+ is coupled through a resistor 133 to a terminal K of waveform correction generator 230. The voltage source at terminal HV is coupled through a resistor 131 to terminal K. The output terminal of amplifier 217 is also coupled to an input terminal of a signal combining circuit 241. An output terminal of waveform correction generator 230 is also coupled to an input terminal of combining circuit 241.

The output terminal of combining circuit 241 is coupled to vertical deflection driver amplifier 243. The output terminal of amplifier 243 is coupled to a quasi-complementary symmetry transistor output stage comprising transistors 245, 247, 248 and 249. The base of transistor 247 is coupled to the output terminal of driver 243 through base-emitter voltage offset diodes 246. The bases of transistors 247 and 245 are biased by coupling the B+ supply through a resistor 270 to diodes 246.

The junction of the emitter of transistor 248 and the collector of transistor 249 forms the output terminal of the vertical deflection amplifier. A deflection winding 251 is coupled through a blocking capacitor 250 to this output terminal and through a feedback resistor 252 to ground. A series resistive divider comprising two resistors 254 and 255 is also coupled across the output terminal and ground. The alternating current voltage signal across feedback resistor 252 is supplied by a capacitor 260 through a portion of a potentiometer 258 to the input terminal of driver stage 243. Direct current feedback obtained from the junction of resistors 254 and 255 is supplied to the input terminal to driver 243 through potentiometer 258.

The output signal from amplifier 243 drives the output amplifier. During the first portion of the vertical deflection trace interval when the signal level at the bases of transistors 245 and 247 is least positive, transistors 245 and 249 conduct, causing deflection current to flow in a first direction through deflection winding 251 and feedback resistor 252 to discharge capacitor 250. As the output waveform of driver amplifier 243 becomes more positive, transistors 247 and 248 become more conductive causing current to flow in a second direction through feedback resistor 252 and deflection winding 251 as capacitor 250 charges through the collector-emitter path of transistor 248.

Elements 201, 203, 205, 207, 212, 217, 230, 241 and 243 of the system may be designed for placement on an integrated circuit chip.

During operation, signal 402 generated at an output terminal of vertical count-down generator 201 is coupled to the base of transistor 203. Signal 402 drives transistor 203 into saturation during the vertical deflection retrace interval, discharging sawtooth generating capacitor 209 to a minimum voltage equal to the saturation collector-emitter drop of transistor 203 plus the forward drops of diodes 205 and 207. Diodes 205 and 207 may or may not be used, as the minimum input voltage sensitivity of amplifier 212 dictates.

As the positive-going pulse portion of waveform 402 terminates, transistor 203 is switched off and capacitor 209 begins to charge through resistors 210 and 211 from the voltage supplies at B+ and HV. Additionally, feedback voltage is supplied from the output terminal of amplifier 212 through feedback resistor 215.

In the system illustrated in FIG. 1, the voltage gain of amplifier stage 212 is chosen to be some value. Assuming for purposes of this discussion a voltage gain of A, the output voltage $e_o$ of amplifier 212 may be written as A times the input voltage $e_i$ of amplifier 212 or $e_o = Ae_i$. The currents $I_{210}$ (current through resistor 210), $I_{211}$ (current through resistor 211), $I_{209}$ (charging current of capacitor 209) and $I_{215}$ (feedback current through resistor 215) can be written as follows, disregarding the input current to amplifier 212:

$$I_{210} = \frac{HV - \frac{e_o}{A}}{R_{210}}, \quad I_{211} = \frac{B+ - \frac{e_o}{A}}{R_{211}}, \quad (1)$$

$$I_{215} = \frac{e_o - \frac{e_o}{A}}{R_{215}}, \text{ and } I_{209} = I_{210} + I_{211} + I_{215}$$

where $R_{210}$, $R_{211}$ and $R_{215}$ are the resistances of resistors 210, 211, and 215, respectively.

However, it is also known that $I_{209}$ may be written as $$I_{209} = C_{209} \frac{de_i}{dt} = \frac{C_{209}}{A} \frac{de_o}{dt} \quad (2)$$

where $C_{209}$ is the capacitance of capacitor 209. Thus, $$\frac{C_{209}}{A} \frac{de_o}{dt} = e_o \left( \frac{A-1}{AR_{215}} - \frac{1}{AR_{211}} - \frac{1}{AR_{210}} \right) + \frac{HV}{R_{210}} + \frac{B+}{R_{211}}. \quad (3)$$

Choosing as a value of the feedback resistance $R_{215}$ $$R_{215} = \frac{R_{210}R_{211}(A-1)}{R_{210}+R_{211}} \text{ yields}$$

$$\frac{de_o}{dt} = \frac{A}{R_{209}} \left[ \frac{HV}{R_{210}} + \frac{B+}{R_{211}} \right]. \quad (4)$$

Integrating both sides of expression (4) gives us an expression for the output voltage of amplifier 212

$$e_o = \frac{A}{C_{209}} \left( \frac{HV}{R_{210}} + \frac{B+}{R_{211}} \right)t. \quad (5)$$

It may be seen that equation (5) is linearly dependent upon time $t$ after the end of the positive going discharge pulse of waveform 402 and upon the high voltage-related voltage HV, assuming B+ is constant.

This output voltage $e_o$ is coupled through network 216 and amplified in amplifier 217 and appears substantially as illustrated in waveform 404, assuming substantial variation from linear charging due to changes in the final anode potential and thus in the voltage coupled to terminal HV. Waveform correction generator 230 contains a pair of cascaded multipliers for cubing the linear component of waveform 404 at terminal S. In this manner, S-shaping of the deflection waveform in deflection winding 251 is achieved. However, it may be seen that if the high voltage related component of waveform 404 is also cubed, then the output waveform of the deflection system, the current in winding 251, will vary as the cube of changes in the final anode voltage. This, of course, will undesirably affect the deflection since deflection current must vary directly with the square root of the high voltage to achieve high voltage invariant deflection.

To prevent the current in winding 251 from reflecting the cube of the accelerating anode voltage changes, the cascaded multipliers of waveform correction generator 230 are chosen to provide an additional correction, that being to correct waveform 506, the output signal at terminal O, to prevent the cube of the high voltage correction from appearing as a component thereof. To this end, the same voltage supplies, B+ and HV, which supply charging current for sawtooth capacitor 209 are coupled to input terminal K of waveform correction generator 230.

It may be seen from the following calculations that the variable high voltage related to the voltage coupled to terminal HV is approximately directly proportional to the sum of the variable high voltage and the nominal value of the high voltage.

For purposes of explanation, let $H_o$ be a constant equal the nominal high voltage coupled to the kinescope anode and $h$ equal the actual high voltage coupled to the kinescope anode. The square root of the actual high voltage $\sqrt{h}$ may be represented by a Taylor's series expansion about $H_o$.

A function of $h$ defined as $f(h)$, may be represented by its Taylor's series $$f(h) = \sum_{n=o}^{\infty} \frac{1}{n!} f^{(n)}(H_o)(h - H_o)^n \quad (6)$$

where $f^{(n)}(H_o)$ represents the $n$th derivative of the function $f(h)$ with respect to $h$ at the voltage $H_o$ and $(h - H_o)^n$ is, of course, the $n$th power of $(h - H_o)$. Therefore, $$f(h) = f^{(o)}(H_o)(h - H_o)^0 + f^{(1)}(H_o)(h - H_o)^1 + f^{(2)}(H_o)(h - H_o)^2 + ... \quad (7)$$

The function $f(h)$ thus represented may be fairly closely approximated by the first two terms thereof:

$$f(h) \simeq f(H_o) + f^{(1)}(H_o)(h - H_o) \text{ or, for } f(h) = h^{1/2},$$
$$h^{1/2} \simeq H_o^{1/2} + \frac{1}{2} H_o^{-1/2}(h - H_o). \quad (8)$$

Simplifying, $$h^{1/2} = \frac{H_o + h}{2H_o^{1/2}}. \quad (9)$$

Since $H_o$ is a constant, the square root of the actual high voltage (i.e., $h^{1/2}$) is approximately directly proportional to the sum of the constant nominal high voltage $H_o$ and the variable high voltage $h$. Similarly, the square root of the actual high volage is approximately directly proportional to any multiple of the sum of $H_o$ and $h$. It may be seen that the voltage supplies B+ and HV may be chosen to provide these multiples of the constant nominal high voltage $H_o$ and the variable high voltage $h$, respectively.

It may be seen from equation (5) that the output signal from amplifier 212 and, thus, the signal at terminal S, can be made proportional to the voltage HV and to B+ by proper scaling of resistors 210 and 211. Thus, the signal at terminal S is proportional to $(H_o + h)/2H_o^{1/2}$ and approximately proportional to $h^{1/2}$. The signal illustrated by waveform 404 at terminal S may be written as $$e_S = Fe_U = FV(H_o + h)t \quad (10)$$

where $F$ and $V$ are appropriate constants and $e_o$ is the output voltage of amplifier 212.

Voltage supplies HV and B+ are coupled to terminal K of waveform correction generator 230 of FIG. 1 and control a current generator which generates a current $2a$ therein. Therefore, an input current $2a$ to the waveform correction circuit's multipliers can also be made proportional to $H_o + h$ by proper scaling of resistors 131 and 133. The current can thus be made equal to $M(H_o + h)$ where M is an appropriate constant. Output terminal O of waveform correction generator 230 supplies a signal 506 which is proportional to $-x^3/a^2$ where $x$ is proportional to the signal coupled to terminal S. Combining circuit 241 adds waveform 506 to waveform 404 at terminal S to achieve waveform 410 at the output terminal of combining circuit 241. Waveform 410 thus will be proportional to $e_S - (x^3)/a^2$. However, $x$, the input current to the multipliers from terminal S, being proportional to the signal coupled to terminal S, may be written as $x = Le_S$ or $x = LFe_0$, L being an appropriate constant.

Thus, $e_{410}$, the signal illustrated by waveform 410 of FIG. 1, may be written as follows:

$$e_{410} = e_S - \frac{(Le_S)^3}{M^2(H_o + h)^2}. \quad (11)$$

Then, $e_{410} = FV(H_o + h)t - \frac{L^3F^3V^3(H_o + h)^3t^3}{M^2(H_o + h)^2}$ or, $$e_{410} = FV(H_o + h)t - \frac{L^3}{M^2}F^3V^3(H_o + h)t^3. \quad (12)$$

Since the current through deflection yoke 251 is directly proportional to $e_{410}$, it is directly proportional to $(H_o + h)$. But, $(H_o + h)$ is approximately directly proportional to $h^{1/2}$ as equation (9) indicates. Thus, the yoke current is substantially directly proportional to the square root of the high voltage, and the vertical scan is therefore substantially independent of changes in the high voltage.

The system of FIG. 1 thus provides S-correction directly proportional to the cube of the input signal at terminal S and a means for rendering vertical deflection substantially independent of changes in the high voltage applied to the kinescope anode. From equations (10) and (11), it may be seen that with the disclosed system the percentage S-correction achieved is independent of changes in the high voltage since $$\frac{x^3/a^2}{e_S} = \frac{L^3F^3V^3t^3(H_o + h)^3/M^2(H_o + h)^2}{FV(H_o + h)t} = \frac{L^3F^2V^2t^2}{M^2}. \quad (13)$$

Figure 2:
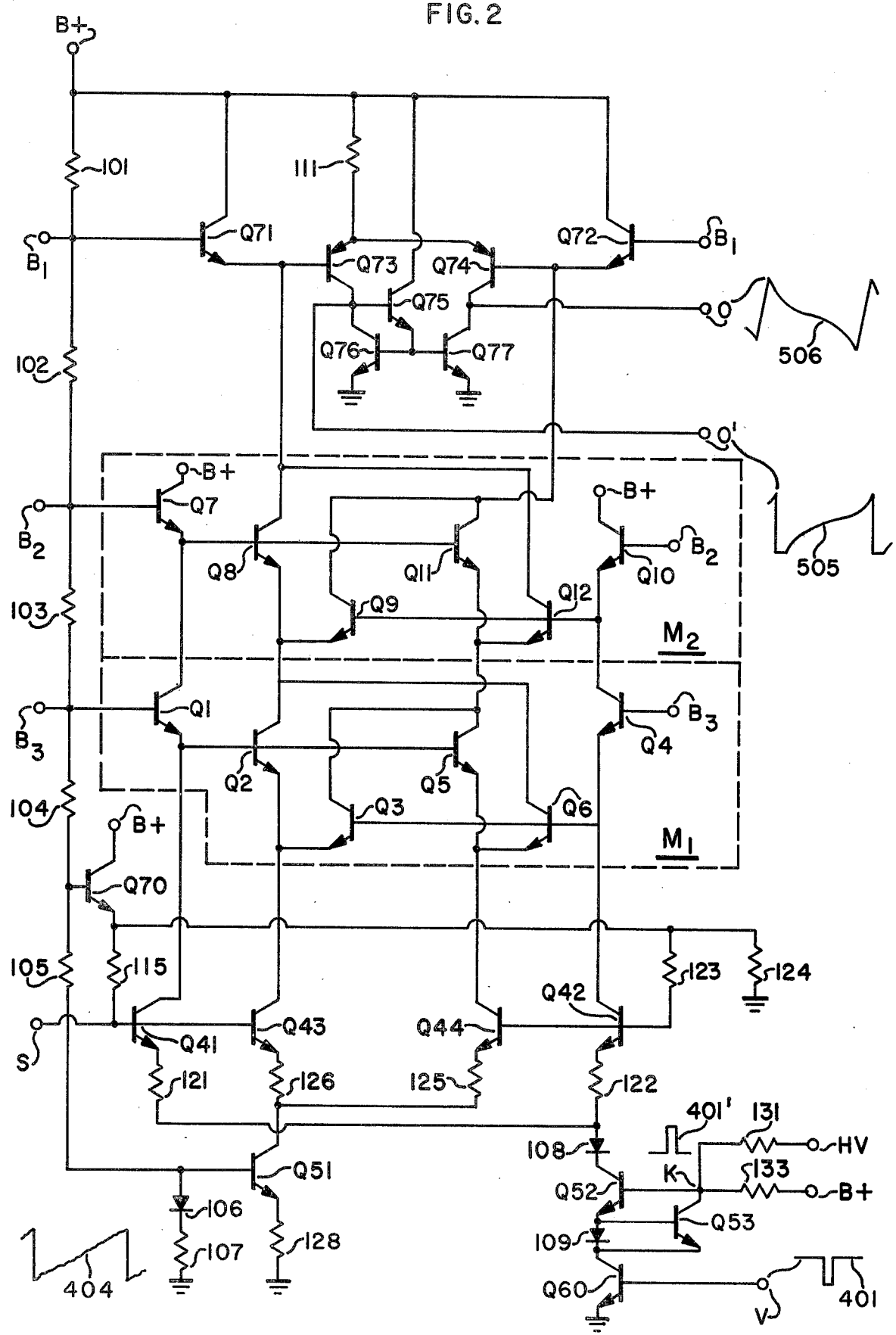

To achieve the desired $-(x^3)/a^2$ correcting signal at terminal O of waveform correction generator 230, the circuit of FIG. 2 used.

Referring to FIG. 2, a preferred embodiment of waveform correction generator 230 of FIG. 1, the collector of a first current source transistor $Q_1$ is coupled to the emitter of a second current source transistor $Q_7$. The collector of $Q_7$ is coupled to supply voltage B+. Its base is coupled to a supply voltage $B_2$. The base of $Q_1$ is coupled to a supply voltage $B_3$. Voltages $B_2$ and $B_3$ are provided by a series voltage divider comprising resistors 101, 102, 103, 104, 105, 107 and diode 106 serially coupled between the B+ voltage supply and ground.

The emitter of $Q_1$ is coupled to the collector of another current source $Q_{41}$. This configuration is duplicated by a transistor $Q_4$ and a transistor $Q_{10}$, the main current conducting paths of which are serially coupled between B+ and the collector of a current source $Q_{42}$.

The bases of two transistors $Q_2$ and $Q_5$ are coupled to the emitter of $Q_1$. The bases of two transistors $Q_3$ and $Q_6$ are coupled to the emitter of $Q_4$. The emitters of $Q_2$ and $Q_3$ are joined as are the emitters of $Q_5$ and $Q_6$. The collectors of $Q_2$ and $Q_6$ are joined as are the collectors of $Q_3$ and $Q_5$. Transistors $Q_1$ through $Q_6$ comprise a first multiplier $M_1$.

This multiplier configuration is duplicated by transistors $Q_8$, $Q_9$, $Q_{11}$, $Q_{12}$, the bases of $Q_8$ and $Q_{11}$ being attached to the emitter of $Q_7$ and the bases of $Q_9$ and $Q_{12}$ being attached to the emitter of $Q_{10}$. Transistors $Q_7$ through $Q_{12}$ comprise a second multiplier $M_2$. The joined collectors of $Q_2$ and $Q_6$ are coupled to the joined emitters of $Q_8$ and $Q_9$. The joined collectors of $Q_3$ and $Q_5$ are coupled to the joined emitters of $Q_{11}$ and $Q_{12}$. Multipliers $M_1$ and $M_2$ are thus coupled in cascade.

The joined emitters of $Q_2$ and $Q_3$ are coupled to the collectors of a transistor $Q_{43}$ of a differential pair comprising $Q_{43}$ and a transistor $Q_{44}$. The collector of $Q_{44}$ is coupled to the joined emitters of $Q_5$ and $Q_6$. The emitters of $Q_{43}$ and $Q_{44}$ are coupled through a pair of resistors 125 and 126. The junction of resistors 125 and 126 is coupled to the collector of a current source transistor $Q_{51}$, the emitter of which is coupled through a resistor 128 to ground. The base of $Q_{51}$ is biased at the drop across the series combination of diode 106 and resistor 107.

The emitters of $Q_{41}$ and $Q_{42}$ are joined in differential configuration through a pair of resistors 121 and 122. The junction of resistors 121 and 122 is coupled to the anode of a blocking diode 108, the cathode of which is coupled to a current source comprising three transistors $Q_{52}$, $Q_{53}$ and $Q_{60}$ and a diode 109. This current source is biased by the voltage at terminal K which is supplied from the voltage source coupled to terminal HV through resistor 131 and from the B+ voltage source through resistor 133. This current source is keyed off during the negative going portion of a vertical rate blanking pulse waveform 401 coupled to terminal V, the base of $Q_{60}$. This waveform is available as a positive going blanking pulse 401 at terminal K.

Terminal S, the base of $Q_{41}$, and $Q_{42}$ are joined through series resistors 115 and 123. The base of $Q_{41}$ is coupled to the base of $Q_{43}$. The base of $Q_{42}$ is coupled to the base of $Q_{44}$. The junction of resistors 115 and 123 is coupled to ground through resistor 124. The emitter of a transistor $Q_{70}$ is coupled to the junction of resistors 115, 123 and 124. The collector of $Q_{70}$ is coupled to the B+ supply and its base is biased at the voltage established at the junction of resistors 104 and 105.

The bases of a pair of transistors $Q_{71}$ and $Q_{72}$ are coupled to a supply potential $B_1$ established at the junction of resistors 101 and 102. The collectors of $Q_{71}$ and $Q_{72}$ are coupled to B+ supply voltage. The emitter of $Q_{71}$ is coupled to the joined collectors of $Q_8$ and $Q_{12}$ and to the base of a transistor $Q_{73}$. The emitter of $Q_{72}$ is coupled to the joined collectors of $Q_9$ and $Q_{11}$ and to the base of a transistor $Q_{74}$. The emitters of $Q_{73}$ and $Q_{74}$ are joined in differential configuration and coupled through a load resistor 111 to the B+ supply. The collectors of $Q_{73}$ and $Q_{74}$ are coupled to the collectors of a transistor $Q_{76}$ and a transistor $Q_{77}$, respectively, at points O′ and O, respectively. The bases of $Q_{76}$ and $Q_{77}$ are joined and the emitter of a transistor $Q_{75}$ is coupled to their joined bases. The base of $Q_{75}$ is coupled to point O′ and its collector is coupled to the B+ supply.

Referring to $Q_1$ through $Q_6$ of FIG. 2, the following expressions relating to the base-emitter voltages of these transistors may be written:

$$B_3 - V_{BEQ1} - V_{BEQ2} + V_{BEQ3} + V_{BEQ4} = B_3;$$

and $$B_3 - V_{BEQ1} - V_{BEQ5} + V_{BEQ6} + V_{BEQ4} = B_3. \quad (14)$$

Thus:

$$V_{BEQ1} - V_{BEQ4} = V_{BEQ3} - V_{BEQ2};$$

and $$V_{BEQ1} - V_{BEQ4} = V_{BEQ6} - V_{BEQ5}. \quad (15)$$

From the diode equation, $V_{BE} = C \ln (I_C)/I_s$ where $V_{BE}$ is the base-emitter voltage, $C$ is a temperature dependent variable, $I_C$ is collector current and $I_s$ is saturation current. Since all of these devices may be so designed to operate at equal temperatures and to exhibit equal saturation currents (e.g., on an integrated circuit chip), equations (15) may be written $$\ln \frac{I_{CQ1}}{I_s} - \ln \frac{I_{CQ4}}{I_s} = \ln \frac{I_{CQ3}}{I_s} - \ln \frac{I_{CQ2}}{I_s} \text{ and} \quad (16)$$

$$\ln \frac{I_{CQ1}}{I_s} - \ln \frac{I_{CQ4}}{I_s} = \ln \frac{I_{CQ6}}{I_s} - \ln \frac{I_{CQ5}}{I_s} \text{ or}$$

$$\frac{I_{CQ1}}{I_{CQ4}} = \frac{I_{CQ3}}{I_{CQ2}} \text{ and } \frac{I_{CQ1}}{I_{CQ4}} = \frac{I_{CQ6}}{I_{CQ5}}. \quad (17)$$

The transistor base currents are negligible in comparison to the collector currents and will be disregarded in this analysis. Thus:

$$\frac{I_{E1}}{I_{E4}} = \frac{I_{CQ3}}{I_{CQ4}} \text{ and } \frac{I_{E1}}{I_{E4}} = \frac{I_{CQ6}}{I_{CQ5}}. \quad (18)$$

$I_{E1}$ and $I_{E4}$, the emitter currents of transistors $Q_1$ and $Q_4$, respectively, may be controlled at some desired values, for example, $I_{E1} = a + x$ and $I_{E4} = a - x$. Similarly, $I_{CQ2} + I_{CQ3}$, the sum of $Q_2$ and $Q_3$ collector currents, and $I_{CQ5} + I_{CQ6}$, the sum of $Q_5$ and $Q_6$ collector currents, may be controlled at, for example, $I_{CQ2} + I_{CQ3} = b + x$ and $I_{CQ5} + I_{CQ6} = b - x$. Thus, the collector currents of $Q_3$ and $Q_5$ are $b + x - I_{CQ2}$ and $b - x - I_{CQ6}$, respectively. Rewriting equations (18), then:

$$\frac{a+x}{a-x} = \frac{b+x-I_{CQ2}}{I_{CQ2}} \text{ and } \frac{a+x}{a-x} = \frac{I_{CQ6}}{b-x-I_{CQ6}}. \quad (19)$$

Solving for $I_{CQ2}$ and $I_{CQ6}$, $$I_{CQ2} = \frac{ab + ax - bx - x^2}{2a}, \quad I_{CQ6} = \frac{ab - ax + bx - x^2}{2a}. \quad (20)$$

Similarly, $$I_{CQ3} = b + x - I_{CQ2} = \frac{ab + ax + bx + x^2}{2a} \text{ and}$$

$$I_{CQ5} = b - x - I_{CQ6} = \frac{ab - ax - bx + x^2}{2a}. \quad (20a)$$

These are the equations for the collector currents of $Q_2$, $Q_3$, $Q_5$ and $Q_6$, the transistors of lower stage $M_1$ of the cascaded multipliers of FIG. 2. The input currents of the upper cascaded multiplier $M_2$ may be found from the above calculations. They are $I_{CQ2} + I_{CQ6}$ and $I_{CQ3} + I_{CQ5}$ or $$I_{CQ2} + I_{CQ6} = b - \frac{x^2}{a} \text{ and}$$

-continued $$I_{CQ3} + I_{CQ5} = b + x - I_{CQ2} + b - x - I_{CQ6} = b + \frac{x^2}{a}. \quad (21)$$

Carrying out the same base-emitter voltage analysis on the upper cascaded multiplier yields the following equations:

$$V_{BEQ7} - V_{BEQ10} = V_{BEQ9} - V_{BEQ8}$$

and $$V_{BEQ7} - V_{BEQ10} = V_{BEQ12} - V_{BEQ11} \quad (22)$$

Letting the collector currents of $Q_8$ and $Q_{12}$, respectively equal $I_{CQ8}$ and $I_{CQ12}$, the collector currents of $Q_9$ and $Q_{11}$, respectively, will be:

$$I_{CQ9} = I_{CQ2} + I_{CQ6} - I_{CQ8} = b - \frac{x^2}{a} - I_{CQ8} \text{ and}$$

$$I_{CQ11} = I_{CQ3} + I_{CQ5} - I_{CQ12} = b + \frac{x^2}{a} - I_{CQ12}. \quad (23)$$

Using the diode equation again, $$\frac{I_{CQ7}}{I_{CQ10}} = \frac{I_{CQ8}}{I_{CQ8}} \text{ and } \frac{I_{CQ7}}{I_{CQ10}} = \frac{I_{CQ12}}{I_{CQ11}}. \quad (24)$$

Again, $I_{CQ7}$ and $I_{CQ10}$ will be $a + x$ and $a - x$, respectively. Substituting these values and those of equations (23) into equations (24):

$$\frac{a+x}{a-x} = \frac{b - \frac{x^2}{a} - I_{CQ8}}{I_{CQ8}}$$

and $$\frac{a+x}{a-x} = \frac{I_{CQ12}}{b + \frac{x^2}{a} - I_{CQ12}}.$$

Solving for $I_{CQ8}$, $I_{CQ12}$ yields:

$$I_{CQ8} = \frac{(a-x)(b - \frac{x^2}{a})}{2a}$$

and $$I_{CQ12} = \frac{(a+x)(b + \frac{x^2}{a})}{2a}. \quad (25)$$

Similarly, $$I_{CQ9} = b - \frac{x^2}{a} - I_{CQ8} = \frac{(a+x)(b - \frac{x^2}{a})}{2a}$$

and $$I_{CQ11} = b + \frac{x^2}{a} - I_{CQ12} = \frac{(a-x)(b + \frac{x^2}{a})}{2a}. \quad (25a)$$

Thus, the sum of the collector currents of $Q_8$ and $Q_{12}$ is $$I_{CQ8} + I_{CQ12} = b + x^3/a^2 \quad (26)$$

and the sum of $Q_9$ and $Q_{11}$ collector currents is $$I_{CQ9} + I_{CQ11} = b - x^3/a^2.$$

It may be seen that the difference between the output currents $I_{CQ8} + I_{CQ12}$ and $I_{CQ9} + I_{CQ11}$ of the cascaded multipliers is directly proportional to the cube of $x$ and inversely proportional to the square of $a$. The sign of the difference may be negative or positive, depending upon whether $I_{CQ8} + I_{CQ12}$ is subtracted from $I_{CQ9} + I_{CQ11}$, or vice versa.

The desired drive currents $I_{E1}$ and $I_{E4}$ are achieved by utilizing the current source comprising $Q_{52}$, $Q_{53}$, $Q_{60}$ and their associated components and the differential amplifier comprising $Q_{41}$ and $Q_{42}$. The current source provides a current equal to $2a$ which will be the sum of the currents $I_{E1}$ and $I_{E4}$ since $I_{E1} = a + x$ and $I_{E4} = a - x$. The differential amplifier configuration provides the $x$-modulation of the collector currents of $Q_{41}$ and $Q_{42}$, both of which equal $\frac{1}{2}(2a) = a$ when no -proportional signal is applied at input terminal S.

In a similar fashion, current source $Q_{51}$ provides a constant sum, $2b$, of the collector currents $b + x$ and $b - x$ of differential amplifier transistors $Q_{43}$ and $Q_{44}$. It may be seen that the x-proportional signal coupled to terminal S also modulates the collector currents of differential amplifier transistors $Q_{43}$ and $Q_{44}$.

Current source $Q_{51}$ is appropriately biased by the voltage across diode 106 and resistor 107 to provide the $2b$ collector current. The current source comprising $Q_{52}$, $Q_{53}$, $Q_{60}$ and their associated components derives bias from the B+ supply through resistor 133 and from the high voltage-proportional voltage supply coupled to terminal HV through resistor 131.

Since the deflection correction signal must vary as the square root of the high voltage to correct for changes therein, the circuit of FIG. 2 provides a method for achieving the desired correction for changes in high voltage as well as S-correction. As was previously shown, the output currents of the circuit of FIG. 2 (at terminals O an O') are inversely proportional to the square of the variable $a$. Thus, the $2a$ current source ($Q_{52}$, $Q_{53}$, $Q_{60}$ and associated components) is controlled by the voltage source B+ and by the voltage source at terminal HV.

To provide a signal representative of the difference current between the two output currents flowing in the output terminals (joined collectors of $Q_8$ and $Q_{12}$ and $Q_9$ and $Q_{11}$) of the upper cascaded multiplier, the difference amplifier comprising $Q_{71}$ through $Q_{74}$ is driven by the current source comprising $Q_{75}$ through $Q_{77}$ and by the output currents of the upper cascaded multipliers at the emitters of $Q_{71}$ and $Q_{72}$. The signals appearing at terminal O and O' are thus proportional to $\pm(I_{CQ9} + I_{CQ11} - I_{CQ8} - I_{CQ12})$, respectively. From equations (26) it may be seen that the output signal at terminal O is proportional $(-x^3)/a^2$ and that at terminal O' is proportional to $x^3/a^2$. Thus, if the high voltage variable sawtooth illustrated by waveform 404 is the input signal to the S- and high voltage correction circuit of FIG. 2, the output signals at terminals O and O' are as illustrated by waveforms 506 and 505, respectively.

It should be noted that the signal at terminal O' rather than that at terminal O may be utilized in the system of FIG. 1. In that situation, it would be necessary to subtract the waveform at terminal O' from that at terminal S to achieve the desired S- and high voltage correction. Thus, combining circuit 241 would have to be a subtracter.

What is claimed is:

1. A deflection waveform correction system for providing S- and accelerating anode voltage change corrections comprising:

a source of voltage related to the square root of said accelerating anode voltage;

means coupled to said source of voltage for generating a periodic deflection sawtooth waveform, the amplitude of which varies with time and with the square root of said accelerating anode voltage;

means coupled to said source of periodic sawtooth waveforms and to said source of voltage related to the square root of said accelerating anode voltage and responsive thereto for decoupling said accelerating anode voltage variations from said sawtooth waveform and for producing an S-corrected waveform substantially independent of said accelerating anode voltage variations; and means coupled to said means for producing said S-correction waveform for combining said accelerating anode voltage variable sawtooth waveform and said S-correction waveform for producing an S- and accelerating anode voltage-corrected waveform which is substantially directly proportional to the square root of said accelerating anode voltage.

2. A deflection waveform correction generator according to claim 1 wherein said source of voltage related to the square root of said accelerating anode voltage comprises summing means coupled to a source of voltage which varies directly with said accelerating anode voltage and to a source of substantially constant voltage.

3. A deflection waveform correction generator according to claim 2 wherein said means coupled to said source of periodic sawtooth waveforms and to said source of voltage related to the square root of said accelerating anode voltage includes coupled multipliers for providing at one or more output terminals of said coupled multipliers waveforms related to the third power of said substantially linearly varying sawtooth waveform for providing said S-correction.

4. A deflection waveform correction system for providing S- and accelerating anode voltage change corrections comprising:

a first source of accelerating anode voltage-related direct current voltage;

a second source of substantially constant direct current voltage;

means periodically chargeable from said first and second sources for producing a sawtooth waveform, the amplitude of which varies substantially as the sum of said first and second source voltages;

multiplying means coupled to said means for producing said sawtooth waveform and to said first and second sources of voltage for being responsive to said sawtooth and to said first and second sources for generating a waveform related to the cube of a linearly varying portion of said sawtooth and having substantially no accelerating anode voltage-related component;

means coupled to said means for producing said sawtooth signals and to said multiplying means for combining said sawtooth and said accelerating anode voltage-independent cubic waveform; and a deflection winding coupled to said combining means for having deflection current generated therein in response to said combined sawtooth and cubic waveform, thereby rendering said deflection current S- and accelerating anode voltage-corrected.

5. A deflection waveform correction system according to claim 4 wherein said multiplying means comprises a pair of cascaded multipliers.

6. A deflection waveform correction system according to claim 4 wherein amplifying means are coupled intermediate said combining means and said deflection winding for amplifying said combined waveforms for driving said deflection winding.

* * * * *

UNITED STATES PATENT OFFICE
CERTIFICATE OF CORRECTION

PATENT NO. : 3,984,729

DATED : October 5, 1976

INVENTOR(S) : Steven Alan Steckler, et al.

It is certified that error appears in the above-identified patent and that said Letters Patent are hereby corrected as shown below:

On the title sheet, following the listing of inventors insert -- Assignee: RCA Corporation, New York, N.Y. -- Column 10, line 12, that portion reading "-proportional" should read -- x-proportional --.

Signed and Sealed this

Eleventh Day of January 1977

[SEAL]

Attest:

RUTH C. MASON
*Attesting Officer*

C. MARSHALL DANN
*Commissioner of Patents and Trademarks*